United States Patent
Inoue et al.

(10) Patent No.: US 7,159,640 B2
(45) Date of Patent: Jan. 9, 2007

(54) MEMBER USED FOR CASTING

(75) Inventors: Kenichi Inoue, Yasugi (JP); Ken Inoue, Yonago (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 11/198,167

(22) Filed: Aug. 8, 2005

(65) Prior Publication Data
US 2006/0032602 A1 Feb. 16, 2006

(30) Foreign Application Priority Data
Aug. 10, 2004 (JP) .............................. 2004-233035

(51) Int. Cl.
*B22C 3/00* (2006.01)
(52) U.S. Cl. ...................... 164/312; 164/138; 164/113
(58) Field of Classification Search ................ 164/113, 164/138, 312
See application file for complete search history.

(56) References Cited

U.S. PATENT DOCUMENTS 4,892,792 A * 1/1990 Sarin et al. ................. 428/698
5,246,787 A   9/1993 Schulz et al.

FOREIGN PATENT DOCUMENTS

| JP | 61-033734 | 2/1986 |
| JP | 05-209261 | 8/1993 |
| JP | 71-12266 | 5/1995 |
| JP | 08-013134 | 1/1996 |
| JP | 10-137915 | 5/1998 |
| JP | 2001-011599 | 1/2001 |
| JP | 2002-307129 | 10/2002 |
| JP | 2004-202512 | 7/2004 |

* cited by examiner

*Primary Examiner*—Kuang Y. Lin
(74) *Attorney, Agent, or Firm*—Sughrue Mion, PLLC

(57) ABSTRACT

A casting member comprising hot-die steel or high-speed steel as base material and having coating layers at least on its working plane, wherein the outermost layer among the coating layers consists essentially of at least one nitride, oxinitride or carnonitride composed mainly of V, and another coating layer comprising at least one nitride, oxinitride or carnonitride composed mainly of Cr is formed as a layer just above the base material. If necessary, an intermediate layer comprising at least one nitride, oxinitride or carnonitride composed mainly of V and Cr may be formed as a coating layer on the boundary surface between the outermost layer and the layer just above the base material. The thickness of the outermost layer is preferably 0.5 to 5.0 µm, the thickness of the layer just above the base material is preferably 0.5 to 3.0 µm, and the thickness of the intermediate layer is preferably 1.0 µm or less. Said casting member has excellent resistance to seizure, resistance to cracking and resistance to waste by melting.

10 Claims, 2 Drawing Sheets

A : NO CRACKING

B : LESS THAN 3/4 OF CIRCUMFERENCE CRACKING

C : 3/4 OR MORE OF CIRCUMFERENCE CRACKING (EXCEPT ALL-AROUND PEELING)

D : ALL-AROUND PEELING 0.5mm

MEMBER USED FOR CASTING

BACKGROUND OF THE INVENTION

The present invention relates to a casting member used in contact with a molten metal, such as a mold used for die casting or casting, a core pin, a piston ring used in an injection machine, or the like.

Steels such as hot-die steel, high-speed steel, stainless steel and the like have been used in casting members used for molding by casting of a molten metal. A metal to be molded that is most frequently used for molding by casting is an aluminum alloy. In the case of the above-mentioned steel materials used in casting members such as molds, the steel material in a portion of the casting member in contact with the aluminum alloy is wasted by melting in a melt of the aluminum alloy to increase the iron content of the aluminum alloy melt and deteriorate the quality of a cast product. Moreover, the waste by melting of the molds and the like causes various operational troubles.

As a measure against the above problem, nitriding on the working plane of a casting member has been often conducted because it gives a deep hardened layer and can be conducted at a very low cost. However, since employment of a high-melting aluminum alloy as a material to be molded has become frequent for the purpose of increasing the strength of a cast product, nitriding has the following disadvantages: N in the hardened layer is easily diffused into an aluminum melt at a high temperature, so that the resistance to the waste by melting is deteriorated by the disappearance of the hardened layer, resulting in rapid progress of the waste-by-melting phenomenon.

In order to solve such a problem, employment of a mold having a working plane coated with a ceramic hardly reactive with a molten metal by physical vapor deposition (hereinafter referred to also as PVD method) has become frequent. There have been proposed, for example, a method in which a base material for mold is subjected to carburizing or nitriding and then a coating layer of TiC, TiN or the like is formed by PVD method (JP-A-61-033734), and a method in which the surface of a mold is coated with a Ti intermediate layer and then TiAlN (JP-A-07-112266). There have also been proposed methods in which CrN is used as a coating layer (JP-A-10-137915 and JP-A-2001-11599).

The use environment of a member used in contact with a melt, such as a casting mold has become very severe because of a recent increased speed of casting cycle and a recent reduced thickness of a mold due to near net shape. That is, the following troubles have come to be remarkably caused: the thermal expansion of a mold or other members by a molten metal during casting; and the deflection of the mold or the members by shrinkage thereof by application of a mold release agent after the solidification of a material to be processed or by the solidification and shrinkage of the material to be processed. As a result, in the coating layers having the compositions proposed in the prior art references 1 to 4, fine cracks are formed during use of a member having the coating layer, and a molten metal infiltrates into the member through cracks and reacts with iron in a base material just under the surface treatment layer of the member to form an alloy. When a portion just under the surface coating layer is expanded by the formation of the alloy, the following phenomenon is observed: the treatment layer is peeled, so that the waste of the member by melting proceeds rapidly.

In addition, the above-mentioned coating layers proposed have no sufficient resistance to seizure to cope with use environment that has become severe in recent years. Therefore, when an explanation is made by taking the case of a mold, seizure occurs between the working plane of the mold and a cast product at the time of release of the cast product from the mold in the early stages of use of the mold, resulting in mold correction cycles, a decrease of the life of the mold and the unsatisfactory shape of the cast product.

The present invention is intended to provide a casting member that is used with its working plane contacted with a high-temperature molten metal, such as a die-casting mold or a core pin, said casting member being free from the problems described above.

SUMMARY OF THE INVENTION

The present inventors noted the mechanism of occurrence of troubles in a casting member used for the purpose described above, and conducted detailed investigation on the influences of the composition, layer structure and forming conditions of a coating layer used on the working plane (the surface to be brought into contact with a melt) of the aforesaid member on the resistance to waste by melting and the resistance to seizure. In addition, the resistance to cracking of the coating layer was investigated in detail for suppressing cracking caused by the deflection of the member.

As a result, it was found that very satisfactory resistance to waste by melting, resistance to seizure and resistance to cracking can be imparted to the casting member by forming a coating layer comprising at least one nitride, oxinitride or carnonitride composed mainly of V, as an outermost layer, and a coating layer comprising at least one nitride, oxinitride or carnonitride composed mainly of Cr, just above a base material. By this result, it was confirmed that for example, a core pin for die casting of an aluminum alloy is markedly improved in life as a casting member because there are sufficiently suppressed local seizure in the early stages of casting and cracking of the coating layers by the deflection of the pin caused at the time of the solidification and shrinkage of a cast product.

That is, a first aspect of the present invention is directed to a casting member comprising hot-die steel or high-speed steel as base material and having coating layers at least on its working plane, wherein the outermost layer among the coating layers comprises at least one nitride, oxinitride or carnonitride composed mainly of V, and another coating layer comprising at least one nitride, oxinitride or carnonitride composed mainly of Cr is formed as a layer just above the base material.

The boundary surface between the above-mentioned outermost layer and layer just above the base material is preferably coated with an intermediate layer comprising at least one nitride, oxinitride or carnonitride composed mainly of V and Cr.

The thickness of the aforesaid outermost layer is 0.5 to 5.0 μm, and the thickness of the layer just above the base material is preferably 0.5 to 3.0 μm. When the aforesaid intermediate layer is formed, its thickness is preferably 1.0 μm or less.

In addition, each of the above-mentioned coating layers is preferably formed by physical vapor deposition. Furthermore, the hardness of the coated base material at a depth of 25 μm from the outermost surface of the base material is preferably higher than that at a depth of 500 μm from the outermost surface of the base material by 100 HV 0.2 or more.

Conventional casting members coated with TiN, TiCN or CrN have become unable to have a sufficient life to cope with use environment that has become severe in recent years. By using a casting member having the surface coating layer structure according to the present invention, the resistance to seizure, resistance to cracking and resistance to waste by melting of a mold can be improved, so that the life of the mold can be greatly improved.

DETAILED DESCRIPTION OF THE INVENTION

Figure 1:
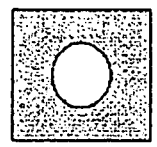
FIG. 1 is a diagram showing a criterion for estimating the degree of cracking in a test for evaluating resistance to cracking by the use of a Rockwell hardness tester.
Figure 1:
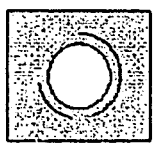
Figure 1:
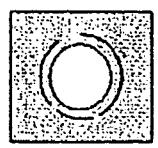
Figure 1:
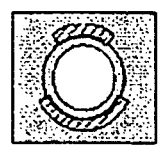

It is not sufficient that a hard coating film to be formed on the working plane of a casting member is investigated by noting its characteristics only for a melt to be brought into contact with the coating film. That is, total characteristics of the coating film have to be investigated by, of course, considering its affinity for the base material. Therefore, as the coating film in the present invention, a composite coating layer is used which can be given as much as possible both characteristics required of the outermost surface to be brought into contact with the melt and required characteristics for the base material. The main role of the outermost layer used in the present invention is to impart resistance to waste by melting, resistance to seizure and resistance to cracking to a casting member. Thus, the presence of the outermost layer is very important. Accordingly, the coating film in the present invention has to have the above characteristics to a high degree with good balance.

By the result of investigation by the present inventors, the following was confirmed: as compared with Ti or Cr nitrides, oxinitride nitrides and carnonitrides, nitrides, oxinitride nitrides and carnonitrides, which are composed mainly of V, impart substantially equal resistance to waste by melting but impart higher resistance to seizure in a temperature range (300 to 600° C.) for using a member such as a mold in die casting of an aluminum alloy or the like. This is because the nitrides, oxinitride nitrides and carnonitrides, which are composed mainly of V, are properly oxidized in the above temperature range, so that the resulting thin oxide layer deteriorates the affinity for a melt. As a result, seizure with a cast product is suppressed. In other words, since all coating layers of any of TiN, TiAlN and CrN, which have heretofore been proposed, are excellent in oxidation resistance, a relatively active surface is retained also during use, so that seizure with a cast product tends to occur.

In addition, the following could be confirmed: the nitrides, oxinitrides and carnonitrides, which are composed mainly of V, have a higher toughness than do the Ti or Cr nitrides, oxinitrides and carnonitrides, namely, they have a composition that permits sufficient suppression of cracking of a coating layer caused by the deflection of a member in use. For the reasons described above, the outermost layer among the coating layers formed on the working plane of the casting member of the present invention comprises at least one nitride, oxinitride or carnonitride composed mainly of V. As to the main constituent V, the proportion of V is preferably 70 (atomic %) or more, more preferably 90 (atomic %) or more (inclusive of substantially 100 (atomic %)), based on the total number of metal (semi-metal) atoms excluding nitrogen, oxygen and carbon atoms.

Next, in the casting member of the present invention, the coating layer formed just above the base material for the casting member (the layer just above the base material) comprises at least one nitride, oxinitride or carnonitride composed mainly of Cr. The nitride, oxinitride or carnonitride composed mainly of Cr gives a coating layer having a low residual compressive stress, an excellent adhesion to the base material and an excellent oxidation resistance. If the adhesion of the layer just above the base material is low, the coating layer is peeled before exhibiting its function.

In the case of the coating film according to the present invention composed of a composite coating layer, if the oxidation resistance of the layer just above the base material, which constitutes the substrate side of the coating film, is low, the low oxidation resistance becomes a cause for peeling of the coating film irrespective of characteristics the outermost layer. For example, when the composite coating layer according to the present invention is formed of substantially two layers, i.e., the above-mentioned outermost layer and the layer just above the base material, the following trouble is caused if the oxidation resistance of the layer just above the base material is lower than that of the outermost layer: oxidation proceeds on the boundary surface between the outermost layer and the layer just above the base material during use, so that the coating film is peeled to be lost before the exhibition of the function of the outermost layer. Therefore, in view of the adhesion and oxidation resistance of the coating layer, the layer just above the base material comprises at least one nitride, oxinitride or carnonitride composed mainly of Cr. In this case, as to the main constituent Cr, the proportion of Cr is preferably 50 (atomic %) or more, more preferably 90 (atomic %) or more (inclusive of substantially 100 (atomic %)), based on the total number of only metal or semi-metal atoms as above.

Although the composite coating layer according to the present invention need not satisfy particular conditions concerning the presence of an intermediate layer between the outermost layer and the layer just above the base material, an intermediate layer capable of reconciling the difference in characteristics between the outermost layer and the layer just above the base material is preferably formed also for taking advantage of excellent characteristics of each of these layers. For example, when the composite coating layer according to the present invention is formed of two layers, i.e., the outermost layer and the layer just above the base material, an intermediate layer comprising at least one nitride, oxinitride or carnonitride composed mainly of V and Cr is preferably present on the boundary surface between the outermost layer and the layer just above the base material. Since the outermost layer and the layer just above the base material are different in composition, cracking by the difference in thermal expansion between these two coating layers is expected to occur on the boundary surface between them in a use environment accompanied by a remarkable thermal impulse or quenching. Therefore, an intermediate layer comprising at least one nitride, oxinitride or carnonitride composed mainly of V and Cr is preferably present on the boundary surface between the outermost layer and the layer just above the base material for the purpose of reconciling the difference in characteristics between these two coating layers.

Next, the thickness of each of the layers constituting the coating layer used in the present invention is described below. The thickness of the outermost layer used in the present invention is preferably 0.5 to 5.0 μm. When the thickness is less than 0.5 μm, no sufficient effect on the resistance to waste by melting, the resistance to seizure and the resistance to cracking cannot be obtained and the outermost layer is early lost particularly by waste by melting. On the other hand, when the outermost layer is formed in a thickness of more than 5.0 μm, it is early peeled in some cases, depending on use conditions. Therefore, the thickness of the outermost layer among coating layers present on the working plane in the present invention is preferably 0.5 to 5.0 μm.

The thickness of the layer just above the base material used in the present invention is preferably 0.5 to 3.0 μm. When the thickness is less than 0.5 μm, this layer is too thin, so that its sufficient adhesion to the base material is difficult to attain. On the other hand, when this layer is formed in a thickness of more than 3.0 μm, the adhesion-improving effect is not enhanced and cracking by the deflection of the member, or the like is undesirably liable to occur from the layer just above the base material. Therefore, the thickness of the layer just above the base material used in the present invention is preferably 0.5 to 3.0 μm.

When the above-mentioned intermediate layer is formed, the thickness of the intermediate layer is preferably 1.00 μm or less. This is because even if the intermediate layer is formed in a thickness of more than 1.00 μm, no remarkable effect of the formation can be obtained. However, when the thickness is too small, the difference in characteristics between the outermost layer and the layer just above the base material cannot be reconciled. Therefore, the thickness of the intermediate layer used in the present invention is preferably 0.05 μm or more. The thickness is more preferably 0.10 to 0.50 μm.

Next, the composition of each of the layers constituting the coating layer used in the present invention is concretely described below. For example, as the composition of the nitride that constitutes the outermost layer used in the present invention, there may be exemplified compositions such as VN, VTiN, VCrN, VBN and the like, which are composed mainly of V. Similarly, as the composition of the nitride that constitutes the layer just above the base material, there may be exemplified compositions relatively excellent in oxidation resistance and heat resistance, such as CrN, CrTiN, CrAlN, CrSiN, CrBN and the like, which are composed mainly of Cr. When the shape of the working plane of a member such as a mold is so complicated that a stress is very liable to be centered at convexities, a coating film of VN, VTiN or the like among the above-exemplified nitrides, which has a relatively low residual stress and an excellent adhesion, is preferably used as the outermost layer. When a coating film having oxidation resistance is required because of a high casting temperature, a coating film of VCrN or the like is preferable.

Although the above description is given by taking the case of the nitrides, the same effect as above can be obtained also by the use of the oxinitrides or the carnonitrides. In addition, although the outermost layer and the layer just above the base material are composed mainly of V and Cr, respectively, a metal element of group IVa, Va or VIa and Al, Si, B or the like may be added to the outermost layer in a proportion of 30 atomic % or less, more preferably 10 atomic % or less and may be added to the layer just above the base material in a proportion of 50 atomic % or less, more preferably a small proportion of 10 atomic % or less. Furthermore, two or more nitrides, oxinitrides or carnonitrides, which are different in composition, may be used in the form of a multi-layer film.

A coating method for forming the coating layer of the casting member of the present invention is not particularly limited. Considering thermal influence on the base material to be coated, the fatigue strength of tools, the adhesion of the coating film, and the like, it is preferable to adopt physical vapor deposition in which a bias voltage is applied to the base material to be coated, such as an arc ion plating method or a sputtering method, in which film formation is possible at a temperature lower than a tempering temperature for hot-die steel or high-speed steel as the base material to be coated, and a compressive stress remains in the coating film.

Furthermore, in the case of the base material to be coated which is used in the present invention, its hardness at a depth of 25 μm from the outermost surface of the base material is preferably higher than that at a depth of 500 μm from the outermost surface of the base material by 100 HV 0.2 or more in terms of Vickers hardness defined in JIS-Z-2244, for the purpose of further improving the wear resistance. That is, it is preferable to carry out previously a surface hardening treatment utilizing diffusion, such as nitriding or carburizing, as a specific example of treatment for achieving the above purpose. In this case, a compound layer such as a nitride layer called a white layer, which is formed by nitriding, or a carbide layer observed in the case of carburizing becomes a cause for the deterioration of the adhesion of the layer just above the base material, and hence is preferably inhibited from forming by controlling the treatment conditions or removed by polishing or the like.

DESCRIPTION OF PREFERRED EMBODIMENT

The present invention is illustrated in detail with reference to the following examples, which should not be construed as limiting the scope of the invention. Changes may be properly made without departing from the gist of the invention and all of them are included in the technical scope of the invention.

EXAMPLE 1

SKD 61 specified in JIS was prepared, and subjected to oil quenching from 1030° C. and then thermal refining to 47 HRC by tempering at 550 to 630° C. Thereafter, the thus treated material was processed into the following test pieces: columnar test pieces with a diameter of 10 mm and a length of 100 mm for evaluating the resistance to waste by melting, plate-shaped test pieces with a thickness of 3 mm and a length of each side of 30 mm for evaluating the resistance to cracking, and discoid test pieces with a diameter of 20 mm and a thickness of 5 mm for evaluating the resistance to seizure. As base materials, the test pieces described above were subjected to coating treatment. Among the test pieces, test pieces to be subjected to surface hardening treatment before the coating treatment were subjected to ion nitriding treatment under the following conditions.

As the surface hardening treatment before the coating treatment, the ion nitriding treatment was carried out by maintaining the test pieces at 500° C. for 10 hours in an atmosphere of $N_2$ in a flow percentage of 5% (balance: $H_2$).

Then, the test surface of each test piece was finished by polishing. By the fact that the hardness at a depth of 25 μm from the surface after the finishing was 680 HV 0.2 in all the test pieces subjected to the nitriding treatment, it was confirmed that the hardness at a depth of 25 μm was higher than the hardness at a depth of 500 μm of 47 HRC (=471 HV 0.2) by 100 HV 0.2. The surfaces of the base materials after the finishing were subjected to the coating treatment under the following conditions together with the surfaces of the other test pieces.

The coating was conducted with an arc ion plating apparatus as follows. A bias voltage of −400 V was applied to each base material to be coated, in an Ar atmosphere (pressure: 0.5 Pa) and plasma cleaning with a hot filament was conducted for 60 minutes. Then, using various metal targets as sources for vapors of metal components and a reaction gas composed of $N_2$ gas as base and optionally $CH_4$ gas and $N_2+O_2$ mixed gas, a film was formed at a temperature of the base material to be coated of 500° C., a reaction gas pressure of 3.0 Pa and a bias voltage of −50 V so that the total thickness of all layers might be about 5 μm. An intermediate layer was formed by operating targets for forming a layer just above the base material and targets for forming an outermost layer, at the same time.

For the test pieces thus obtained, the resistance to waste by melting, resistance to cracking and resistance to seizure of the coated surface of each test piece were evaluated. Evaluation test conditions for each of these resistances are described below.

(1) Test for Evaluating the Resistance to Waste by Melting in a Molten Metal

Each test piece was immersed in a melt of an aluminum alloy AC4C at 750° C. for 3 hours, and the resistance to waste by melting was evaluated in terms of the ratio between the mass values of the test piece before and after the test.

(2) Test for Evaluating the Resistance to Cracking

A dent was formed on the coated surface (30 mm×30 mm) with a Rockwell hardness tester (C scale), after which the vicinity of the dent was observed under an optical microscope and cracks formed around the dent were estimated according to the criterion shown in FIG. 1. As to this estimation, since the vicinity of the dent is protuberant, cracking is caused as shown in FIG. 1 when the resistance to cracking of the coating layer is low.

(3) Test for Evaluating the Resistance to Seizure

For evaluating the resistance to seizure, a ball-on-disc frictional wear tester manufactured by CSM Instruments was used. Using a ball of pure aluminum as a partner material, the coefficient of friction of each test piece was measured on a disc surface with a diameter of 20 mm as coated surface under the following conditions: turning radius 3 mm, peripheral speed 150 mm/s, load 2 N, friction distance 100 m, test temperature 500° C., and no lubrication. For the evaluation, values of the coefficient of friction during the test were input into an attached personal computer and the average of these values was calculated. The average values thus obtained were compared.

Table 1 shows the details of the coating layers of each test piece and the results of the evaluations. In the case of comparative test pieces and conventional test pieces, which did not have the coating layer structure used in the present invention, the definition of their outermost layer, layer just above the base material and intermediate layer is difficult. These layers are shown as in Table 1 for facilitating the understanding of comparison with the present invention. Before and after the coating treatment, there was no change in the above-mentioned hardness values of the base material adjusted by the surface hardening treatment before the coating treatment.

TABLE 1

| | No. | Nitriding | Layer just above base material (thickness) | Intermediate layer (thickness) | Outermost layer (thickness) | Resistance to waste by melting (%) | * Resistance to cracking | Resistance to seizure coefficient of friction |
|---|---|---|---|---|---|---|---|---|
| Present inventive test piece | 1 | Conducted | $(Cr_{0.95}B_{0.05})ON$ (2.5 μm) | — | $(V_{0.75}Ti_{0.25})N$ (2.7 μm) | 0.51 | A | 0.55 |
| | 2 | — | $(Cr_{0.70}Al_{0.30})N$ (1.5 μm) | VCrAlN (0.1 μm) | VN (3.5 μm) | 0.50 | A | 0.52 |
| | 3 | — | CrN (2.2 μm) | — | VN (3.0 μm) | 0.56 | A | 0.52 |
| | 4 | Conducted | $(Cr_{0.95}Si_{0.05})N$ (1.5 μm) | — | $(V_{0.85}Cr_{0.15})N$ (3.7 μm) | 0.48 | A | 0.55 |
| | 5 | — | CrN (2.3 μm) | CrVN (0.2 μm) | VN (2.6 μm) | 0.54 | A | 0.51 |
| | 6 | Conducted | $(Cr_{0.70}Al_{0.30})CN$ (1.8 μm) | — | VCN (3.2 μm) | 0.56 | A | 0.50 |
| | 7 | — | $(Cr_{0.70}Ti_{0.30})N$ (2.1 μm) | CrVTiBN (0.3 μm) | $(V_{0.90}B_{0.10})N$ (2.8 μm) | 0.55 | A | 0.48 |
| | 8 | — | $(Cr_{0.95}Si_{0.05})N$ (1.8 μm) | CrVTiSiN (0.4 μm) | $(V_{0.75}Ti_{0.25})N$ (2.7 μm) | 0.53 | A | 0.54 |
| | 9 | Conducted | CrN (2.0 μm) | CrVN (0.3 μm) | VON (2.7 μm) | 0.51 | A | 0.51 |
| Comparative test piece | 11 | — | CrN (2.5 μm) | — | $(Ti_{0.75}V_{0.25})N$ (2.7 μm) | 0.54 | C | 0.82 |
| | 12 | — | CrN (2.1 μm) | CrTiN (0.5 μm) | TiN (2.5 μm) | 0.55 | C | 0.84 |
| | 13 | — | TiN (2.7 μm) | — | CrN (2.2 μm) | 0.52 | C | Test was discontinued at a friction distance of 65 m |
| | 14 | — | $(Cr_{0.70}Ti_{0.30})N$ | — | $(Ti_{0.50}Al_{0.50})N$ | 0.67 | D | Test was |

TABLE 1-continued

| | No. | Nitriding | Layer just above base material (thickness) | Intermediate layer (thickness) | Outermost layer (thickness) | Resistance to waste by melting (%) | * Resistance to cracking | Resistance to seizure coefficient of friction |
|---|---|---|---|---|---|---|---|---|
| | | | (2.0 μm) | | (3.2 μm) | | | discontinued at a friction distance of 45 m |
| | 15 | — | $(Ti_{0.15}Cr_{0.25})N$ (2.6 μm) | — | VN (2.6 μm) | 0.56 | C | 0.52 |
| | 16 | — | $(Ti_{0.50}Al_{0.05})N$ (2.1 μm) | VTiAlN (0.3 μm) | VN (2.5 μm) | 1.05 | D | 0.50 |
| Conventional test piece | 21 | — | TiN (5.1 μm) | — | — | 0.55 | C | 0.85 |
| | 22 | — | CrN (5.4 μm) | — | — | 0.58 | B | Test was discontinued at a friction distance of 63 m |
| | 23 | — | $(Ti_{0.50}Al_{0.50})N$ (4.5 μm) | — | — | 1.12 | D | Test was discontinued at a friction distance of 48 m |

*) A: no cracking
B: less than ¾ of circumference cracking
C: ¾ or more of circumference cracking (except all-around peeling)
D: all-around peeling It can be seen that as shown in Table 1, all of the present inventive test pieces are very excellent in resistance to waste by melting, resistance to cracking and resistance to seizure because their coating layer structure was within the range specified in the present invention.

On the other hand, as to the evaluation results for the comparative test pieces and the conventional test pieces, the results of evaluating their resistance to waste by melting were equal to those obtained for the present inventive test pieces, in the case of all of the samples obtained by using a coating layer composed of a CrN or TiN type material as base, as an outermost layer or a layer just above the base material, such as comparative test pieces Nos. 11, 12, 13, 14 and 15 and conventional test pieces Nos. 21 and 22. However, in the case of comparative test piece No. 16 and conventional test piece No. 23, which were obtained by using a coating layer of a TiAlN type material as a layer just above the base material, the rate of waste by melting was increased, namely, the resistance to waste by melting was low. The reason is conjectured as follows: since the above-mentioned coating layer composed of a CrN or TiN type material as base was relatively good in adhesion, it was not peeled by thermal impulse or the difference in thermal expansion between the coating layer and the base material when the test piece was immersed in the melt of the aluminum alloy.

In the case of comparative test pieces Nos. 11, 12, 13 and 14 having an outermost layer not following the specifications imposed in the present invention and conventional test pieces Nos. 21, 22 and 23 having a fundamental coating structure different from that used in the present invention, the coefficient of friction with aluminum was increased, resulting in a low resistance to seizure. Particularly in the case of comparative test pieces Nos. 13 and 14 having a coating layer of a CrN or TiAlN type material as an outermost layer and conventional test pieces Nos. 22 and 23, aluminum as partner material underwent seizure during the friction test, so that the test was discontinued.

As to the resistance to cracking of the coating layer, the coating layer was cracked in comparative test pieces Nos. 11, 12 and 13 because their outermost layer did not follow the specifications imposed in the present invention, and the coating layer was cracked in comparative test pieces Nos. 15 and 16 because their layer just above the base material did not follow the specifications imposed in the present invention. Thus, the resistance to cracking was lower than that attained by the present invention.

Figure 2:
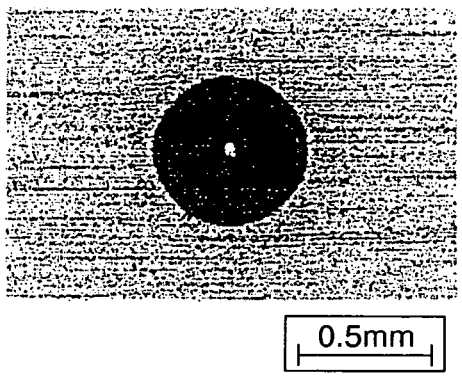
FIG. 2 is a photomicrograph showing the result of a test for evaluating the resistance to cracking of present inventive test piece No. 5 (the state of the vicinity of a Rockwell dent).
Figure 3:
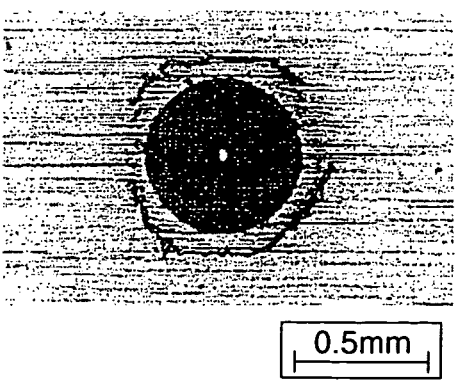
FIG. 3 is a photomicrograph showing the result of a test for evaluating the resistance to cracking of comparative test piece No. 12 (the state of the vicinity of a Rockwell dent).
Figure 4:
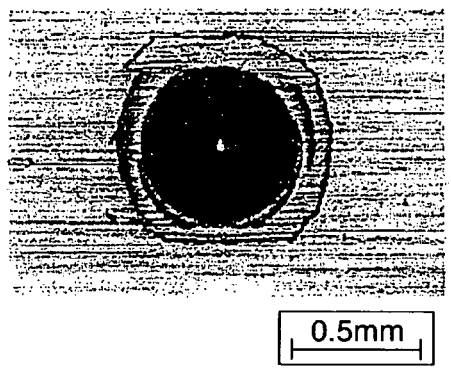
FIG. 4 is a photomicrograph showing the result of a test for evaluating the resistance to cracking of conventional test piece No. 23 (the state of the vicinity of a Rockwell dent).

FIG. 2, FIG. 3 and FIG. 4 are diagrams showing the results of evaluating the resistance to cracking (the state of the vicinity of a dent formed in Rockwell hardness test) of present inventive test piece No. 5, comparative test piece No. 12 and conventional test piece No. 23, respectively. No cracking is observed in the present inventive test piece shown in FIG. 2 (rating A). Cracking is observed around the dent in the comparative test piece shown in FIG. 3 (rating C) and the conventional test piece shown in FIG. 4 (rating D).

EXAMPLE 2

Next, core pins for die casting having a surface coating layer structure equal to those of present inventive test pieces Nos. 2, 3 and 5 and conventional test piece No. 22, respectively were produced and then evaluated with respect to their life in an actual mold.

First, a toughness-improved material composed of high-speed steel as base and having the chemical composition shown in Table 2 was roughly processed in an annealed state into a shape similar to that of a core pin, and subjected to oil quenching at 1080° C. and then thermal refining to 55 HRC by tempering at 600° C. Thereafter, finish processing was conducted and coating treatment was carried out under the same conditions as in Example 1 for obtaining each of the core pins described above. No surface hardening treatment was carried out before the coating treatment. In each of the core pins thus obtained, both of its hardness values at depths of 25 μm and 500 μm from the outermost surface of its base material were maintained at the above-mentioned thermal refining hardness 55 HRC (=595 HV 0.2) before and after the coating treatment.

TABLE 2

| | Chemical composition (mass %) | | | | | | | |
|---|---|---|---|---|---|---|---|---|
| | C | Si | Mn | Cr | W | Mo | V | Co | Fe |
| Base material for care pin | 0.50 | 0.15 | 0.45 | 4.20 | 1.50 | 2.00 | 1.20 | 0.75 | Balance |

Figure 5:
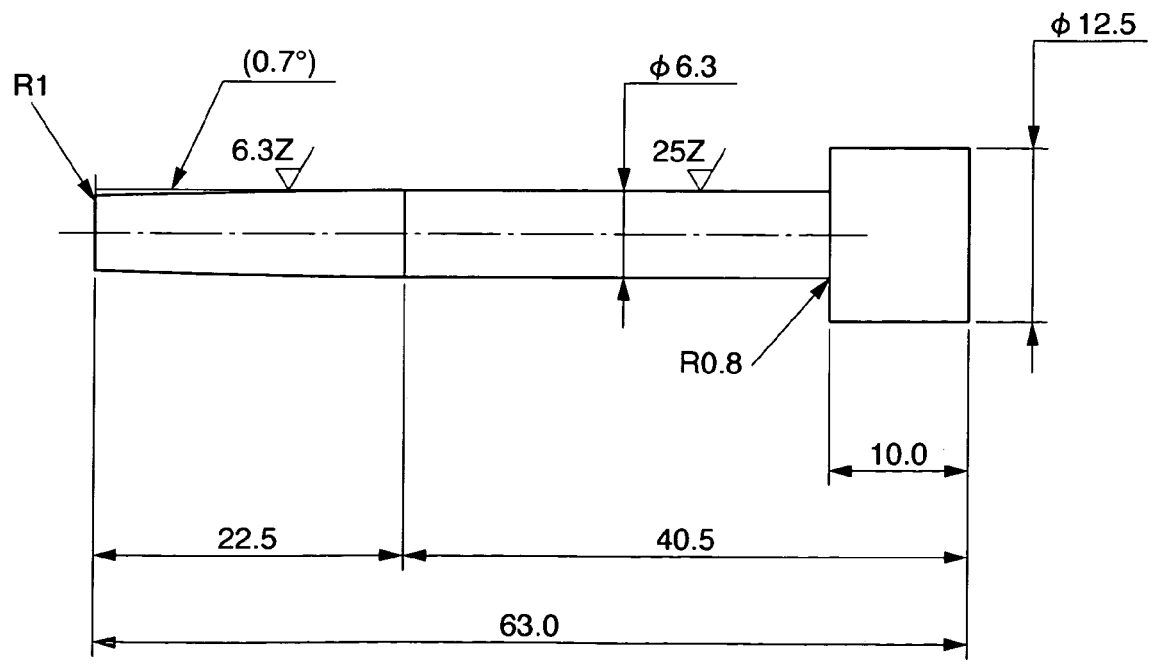
FIG. 5 is a diagram showing the shape of the core pin used in Example 2.

The core pins produced above had the shape shown in FIG. 5. Casting was conducted with a die casting machine of 300 t by using an aluminum alloy AC4C at a melt temperature of 700° C. Table 3 shows the life of the various core pins.

TABLE 3

| | No. | Tool life (number of cast products) | Cause for expiration of life |
|---|---|---|---|
| Present inventive core pin | No. 2 | 72,000 | Seizure |
| | No. 3 | 65,000 | |
| | No. 5 | 69,000 | |
| Conventional core pin | No. 22 | 21,000 | Breaking |

The core pins obtained according to the present invention improved the life of a mold by a factor of three or more as compared with the conventional core pin. Finally, the life of the core pins obtained according to the present invention expired owing to the occurrence of seizure. On the other hand, the conventional core pin early underwent seizure at its pointed end and then its life expired owing to breaking. It was confirmed that as described above, the application of the present invention to a core pin for die casting greatly improves the life of the pin.

The present invention relates to a casting member used in contact with a molten metal, such as a mold used for die casting or casting, a core pin, a piston ring used in an injection machine, or the like. The molten metal (a casting material) is not limited to aluminum and aluminum alloys, and the casting member can be used also for casting a magnesium alloy. Considering, for example, that the coating layer of the casting member is excellent in resistance to seizure with nonferrous metals, the present invention can be applied to molds or tools for forging, for example, aluminum, magnesium and their alloys.

The invention claimed is:

1. The casting mold member used for casting comprising hot-die steel or high-speed steel as base material and having coating layers at least on its working plane, wherein the outermost layer among the coating layers consisting essentially of at least one of nitride, oxynitride or carbonitride composed mainly of V, and another coating layer comprising at least one of nitride, oxynitride or carbonitride composed mainly of Cr is formed as a layer just above the base material.

2. The casting mold member used for casting according to claim 1, wherein the thickness of said outermost layer is 0.5 to 5.0 μm, and the thickness of said layer just above the base material is 0.5 to 3.0 μm.

3. The casting mold member used for casting according to claim 1, wherein an intermediate layer consisting essentially of at least one of nitride, oxynitride or carbonitride composed mainly of V and Cr is present on the boundary between said outermost layer and said layer just above the base material.

4. The casting mold member used for casting according to claim 3, wherein the thickness of said intermediate layer is 1.00 μm or less.

5. The casting mold member used for casting according to claim 1, wherein each of the coating layers is formed by physical vapor deposition.

6. The casting mold member used for casting according to claim 1, wherein the hardness of the base material at a depth of 25 μm from the outermost surface for being coated is higher than that at a depth of 500 μm from the outermost surface for being coated by 100 HV 0.2 or more.

7. The casting mold member used for casting according to claim 3, wherein each of the coating layers is formed by physical vapor deposition.

8. The casting mold member used for casting according to claim 3, wherein the hardness of the base material at a depth of 25 μm from the outermost surface for being coated is higher than that at a depth of 500 μm from the outermost surface for being coated by 100 HV 0.2 or more.

9. The casting mold member according to claim 1, which is a core pin.

10. The casting mold member according to claim 1, which is a piston ring.

* * * * *